(12) United States Patent
Zhu et al.

(10) Patent No.: US 7,314,802 B2
(45) Date of Patent: Jan. 1, 2008

(54) STRUCTURE AND METHOD FOR MANUFACTURING STRAINED FINFET

(75) Inventors: Huilong Zhu, Poughkeepsie, NY (US); Bruce B. Doris, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/669,598

(22) Filed: Jan. 31, 2007

(65) Prior Publication Data

US 2007/0122984 A1    May 31, 2007

Related U.S. Application Data

(62) Division of application No. 10/906,335, filed on Feb. 15, 2005, now Pat. No. 7,224,033.

(51) Int. Cl.
*H01L 21/336* (2006.01)
*H01L 21/00* (2006.01)
*H01L 21/84* (2006.01)
*H01L 21/338* (2006.01)

(52) U.S. Cl. .................. 438/283; 438/157; 438/176

(58) Field of Classification Search ........... 438/283, 438/157, 176; 257/413, 353, E21.442, E21.623, 257/E21.637
See application file for complete search history.

(56) References Cited

U.S. PATENT DOCUMENTS

| 3,602,841 | A | 8/1971 | McGroddy |
| 4,665,415 | A | 5/1987 | Esaki et al. |
| 4,853,076 | A | 8/1989 | Tsaur et al. |
| 4,855,245 | A | 8/1989 | Neppl et al. |
| 4,952,524 | A | 8/1990 | Lee et al. |
| 4,958,213 | A | 9/1990 | Eklund et al. |
| 5,006,913 | A | 4/1991 | Sugahara et al. |
| 5,060,030 | A | 10/1991 | Hoke et al. |
| 5,081,513 | A | 1/1992 | Jackson et al. |

(Continued)

FOREIGN PATENT DOCUMENTS

EP          01162362         6/1989

(Continued)

OTHER PUBLICATIONS

Sayama et al., "Effect of <100> Channel Direction for High Performance SCE Immune pMOSFET, with Less Than 0.15um Gate Length", IEEE, IEDM, 1999; pp. 27.5.1-27.5.4.

(Continued)

*Primary Examiner*—Shouxiang Hu
(74) *Attorney, Agent, or Firm*—Scully, Scott, Murphy & Presser, P.C.; Joseph P. Abate, Esq.

(57) ABSTRACT

A part of the gate of a FINFET is replaced with a stress material to apply stress to the channel of the FINFET to enhance electron and hole mobility and improve performance. The FINFET has a SiGe/Si stacked gate, and before silicidation the SiGe part of the gate is selectively etched to form a gate gap that makes the gate thin enough to be fully silicidated. After silicidation, the gate-gap is filled with a stress nitride film to create stress in the channel and enhance the performance of the FINFET.

18 Claims, 22 Drawing Sheets

U.S. PATENT DOCUMENTS

| | | | |
|---|---|---|---|
| 5,108,843 A | 4/1992 | Ohtaka et al. |
| 5,134,085 A | 7/1992 | Gilgen et al. |
| 5,310,446 A | 5/1994 | Konishi et al. |
| 5,354,695 A | 10/1994 | Leedy |
| 5,371,399 A | 12/1994 | Burroughes et al. |
| 5,391,510 A | 2/1995 | Hsu et al. |
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy |
| 5,592,007 A | 1/1997 | Leedy |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,840,593 A | 11/1998 | Leedy |
| 5,861,651 A | 1/1999 | Brasen et al. |
| 5,880,040 A | 3/1999 | Sun et al. |
| 5,940,716 A | 8/1999 | Jin et al. |
| 5,940,736 A | 8/1999 | Brady et al. |
| 5,946,559 A | 8/1999 | Leedy |
| 5,960,297 A | 9/1999 | Saki |
| 5,989,978 A | 11/1999 | Peidous |
| 6,008,126 A | 12/1999 | Leedy |
| 6,025,280 A | 2/2000 | Brady et al. |
| 6,046,464 A | 4/2000 | Schetzina |
| 6,066,545 A | 5/2000 | Doshi et al. |
| 6,090,684 A | 7/2000 | Ishitsuka et al. |
| 6,107,143 A | 8/2000 | Park et al. |
| 6,117,722 A | 9/2000 | Wuu et al. |
| 6,133,071 A | 10/2000 | Nagai |
| 6,165,383 A | 12/2000 | Chou |
| 6,221,735 B1 | 4/2001 | Manley et al. |
| 6,228,694 B1 | 5/2001 | Doyle et al. |
| 6,246,095 B1 | 6/2001 | Brady et al. |
| 6,255,169 B1 | 7/2001 | Li et al. |
| 6,261,964 B1 | 7/2001 | Wu et al. |
| 6,265,317 B1 | 7/2001 | Chiu et al. |
| 6,274,444 B1 | 8/2001 | Wang |
| 6,281,532 B1 | 8/2001 | Doyle et al. |
| 6,284,623 B1 | 9/2001 | Zhang et al. |
| 6,284,626 B1 | 9/2001 | Kim |
| 6,319,794 B1 | 11/2001 | Akatsu et al. |
| 6,361,885 B1 | 3/2002 | Chou |
| 6,362,082 B1 | 3/2002 | Doyle et al. |
| 6,368,931 B1 | 4/2002 | Kuhn et al. |
| 6,403,486 B1 | 6/2002 | Lou |
| 6,403,975 B1 | 6/2002 | Brunner et al. |
| 6,406,973 B1 | 6/2002 | Lee |
| 6,461,936 B1 | 10/2002 | von Ehrenwall |
| 6,476,462 B2 | 11/2002 | Shimizu et al. |
| 6,483,171 B1 | 11/2002 | Forbes et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Jan et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,621,392 B1 | 9/2003 | Volant et al. |
| 6,635,506 B2 | 10/2003 | Volant et al. |
| 6,717,216 B1 | 4/2004 | Doris et al. |
| 6,825,529 B2 | 11/2004 | Chidambarrao et al. |
| 6,831,292 B2 | 12/2004 | Currie et al. |
| 6,838,322 B2 | 1/2005 | Pham et al. |
| 6,855,990 B2 | 2/2005 | Yeo et al. |
| 6,867,433 B2 | 3/2005 | Yeo et al. |
| 6,909,151 B2 | 6/2005 | Hareland et al. |
| 6,974,981 B2 | 12/2005 | Chidambarrao et al. |
| 6,977,194 B2 | 12/2005 | Belyansky et al. |
| 7,015,082 B2 | 3/2006 | Doris et al. |
| 2001/0009784 A1 | 7/2001 | Ma et al. |
| 2002/0063292 A1 | 5/2002 | Armstrong et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2004/0113174 A1 | 6/2004 | Chidambarrao et al. |
| 2004/0113217 A1 | 6/2004 | Chidambarrao et al. |
| 2004/0238914 A1 | 12/2004 | Deshpande et al. |
| 2004/0262784 A1 | 12/2004 | Doris et al. |
| 2005/0040460 A1 | 2/2005 | Chidambarrao et al. |
| 2005/0082634 A1 | 4/2005 | Doris et al. |
| 2005/0093030 A1 | 5/2005 | Doris et al. |
| 2005/0098829 A1 | 5/2005 | Doris et al. |
| 2005/0106799 A1 | 5/2005 | Doris et al. |
| 2005/0145954 A1 | 7/2005 | Zhu et al. |
| 2005/0148146 A1 | 7/2005 | Doris et al. |
| 2005/0194699 A1 | 9/2005 | Belyansky et al. |
| 2005/0236668 A1 | 10/2005 | Zhu et al. |
| 2005/0245017 A1 | 11/2005 | Belyansky et al. |
| 2005/0280051 A1 | 12/2005 | Chidambarrao et al. |
| 2005/0282325 A1 | 12/2005 | Belyansky et al. |
| 2006/0027868 A1 | 2/2006 | Doris et al. |
| 2006/0057787 A1 | 3/2006 | Doris et al. |
| 2006/0060925 A1 | 3/2006 | Doris et al. |

FOREIGN PATENT DOCUMENTS

| | | |
|---|---|---|
| EP | 0967636 A2 | 12/1999 |
| EP | 0967636 A3 | 7/2000 |
| EP | 1174928 | 1/2002 |
| JP | 6476755 | 3/1989 |
| WO | WO9427317 | 11/1994 |
| WO | WO0245156 A2 | 6/2002 |
| WO | WO0245156 A3 | 6/2002 |

OTHER PUBLICATIONS

Yan, Ran-Hong et al., "Scaling the Si MOSFET: From Bulk to SOI to Bulk", IEEE Transactions on Electron Devices, Jul. 1992, pp. 1704-1710, vol. 39, No. 7.

Rim et al., "Transductance Enhancement in Deep Submicron Strained-Si n-MOSFETs", International Electron Devices Meeting, IEEE, 1998, 26.8.1-26.8.4.

Rim et al., "Characteristics and Device Design of Sub-100 nm Strained Si N- and PMOSFETs", Symposium on VLSI Technology Digest of Technical Papers, IEEE, 2002, pp. 98-99.

Scott et al., NMOS Drive Current Reduction Caused by Transistor Layout and Trench Isolation Induced Stress, International Electron Devices Meeting, IEEE, 1999, 34.4.1-34.4.4.

Ootsuka et al., "A Highly Dense, High-Performance 130nm Node CMOS Technology for Large Scale System-on-a-Chip Applications", International Electron Devices Meeting, IEEE, 2000, 23.5.1-23.5.4.

Ito et al., "Mechanical Stress Effect of Etch-Stop Nitride and its Impact on Deep Submicron Transistor Design", International Electron Devices Meeting, IEEE, 2000, 10.7.1-10.7.4.

Shimizu et al., "Local Mechanical-Stress Control (LMC): A New Technique for CMOS-Performance Enhancement", International Electron Devices Meeting, IEEE, 2001, 19.4.1-19.4.4.

Ota et al., "Novel Locally Strained Channel Technique for High Performance 55nm CMOS", International Electron Devices Meeting, IEEE, 2002, pp. 27-30, 2.2.1-2.2.4.

Zhang et al. "A New 'Mixed-Mode' Reliability Degradation Mechanism in Advanced Si and SiGe Bipolar Transistors", IEEE, 2002, pp. 2151-2156.

Momose et al., "Temperature Dependence of Emitter-Base Reverse Stress Degradation and its Mechanism Analyzed by MOS Structures", IEEE, Paper 6.2, 1989, pp. 140-143.

Huang et al., "Temperature Dependence and Post-Stress Recovery of Hot Electron Degradation Effects in Bipolar Transistors", Bipolar Circuits and technology Meeting 7.5, IEEE, 1991, pp. 170-173.

Li et al., "Design of W-Band VCOs with high Output Power for Potential Application in 77GHz Automotive Radar Systems", GaAs Digest, IEEE, 2003, pp. 263-266.

Wurzer et al. "Annealing of Degraded npn-Transistors-Mechanisms and Modeling", Transactions on Electron Devices, IEEE, 1994, pp. 533-538, vol. 41, No. 4.

Doyle et al., "Recovery of Hot-Carrier Damage in Reoxidized Nitrided Oxide MOSFET's" Electron Device Letters, IEEE, 1992, pp. 38-40, vol. 13, No. 1.

Momose et al., "Analysis of the Temperature Dependence of Hot-Carrier-Induced Degradation in Bipolar Transistors for Bi-CMOS", Transactions on Electron Devices, IEEE, 1994, pp. 978-987, vol. 41, No. 6.

Khater et al., "SiGe HBT Technology with Fmax/Ft = 350/300 GHz and Gate Delay Below 3.3ps", IEEE, 2004.

Bean et al., "$GE_x Si_{1-x}/Si$ Strained-Layer Superlattice Grown by Molecular Beam Epitaxy", J. Vac. Sci. Technol., 1984, pp. 436-440, vol. A 2, No. 2.

Van Der Merwe, "Regular Articles", Journal of Applied Physics, 1963, pp. 117-122, vol. 34, No. 1.

Matthews et al., "Defects in Epitaxial Multilayers", Journal of Crystal Growth, 1974, pp. 118-125, vol. 27.

Iyer et al., "Heterojunction Bipolar Transistors Using Si-Ge Alloys", Transactions on Electron Devices, IEEE, 1989, pp. 2043-2064, vol. 36, No. 10.

Van De Leur et al., "Critical Thickness for Pseudomorphic Growth of Si/Ge Alloys and Superlattices", J. Appl. Phys., 1988, pp. 3043-3050, vol. 64, No. 6.

Houghton et al., "Equilibrium Critical Thickness for $Si_{1-x}Ge_x$ Strained Layers on (100) Si", Appl. Phys. Lett., 1990, pp. 460-462, vol. 56, No. 29.

Ouyang et al., "Two-Dimensional Bandgap Engineering in a NOVEL Si/SiGe pMOSFET With Enhanced Device Performance and Scalability," IEEE, 2000, pp. 151-154.

STRUCTURE AND METHOD FOR MANUFACTURING STRAINED FINFET

RELATED APPLICATIONS

This application is a divisional of U.S. application Ser. No. 10/906,335, filed Feb. 15, 2005 now U.S. Pat. No. 7,224,033.

BACKGROUND OF THE INVENTION

1. Field of the Invention

The present invention relates generally to a structure of a strained double-gated metal oxide semiconductor field effect transistor (MOSFET) having a very thin vertical silicon layer (a FIN) for the channel, referred to as a FINFET, and a method for manufacturing a strained FINFET that replaces a part of the gate of the FINFET with a stress material to apply stress to the channel of the FINFET. The stress enhances electron and hole mobility and improves the performance of the FINFET. More particularly, the SiGe part of a SiGe/Si stacked gate of a FINFET is replaced with a stress nitride film to apply stress to the channel of the FINFET.

2. Discussion of the Prior Art

Over the past twenty-five years or so, the primary challenge of very large scale integration (VLSI) has been the integration of an ever-increasing number of metal oxide semiconductor field effect transistor (MOSFET) devices with high yield and reliability. This was achieved mainly in the prior art by scaling down the MOSFET channel length without excessive short-channel effects. As is known to those skilled in the art, short-channel effects are the decrease of threshold voltage $V_t$ in short-channel devices due to two-dimensional electrostatic charge sharing between the gate and the source/drain diffusion regions.

To scale down MOSFET channel lengths without excessive short-channel effects, gate oxide thickness has to be reduced while increasing channel-doping concentration. However, Yan, et al., "Scaling the Si MOSFET: From bulk to SOI to bulk", IEEE Trans. Elect. Dev., Vol. 39, p. 1704, July 1992, have shown that to reduce short-channel effects for sub-0.05 µm MOSFETs, it is important to have a backside-conducting layer present in the structure that screens the drain field away from the channel. The Yan, et al. results show that double-gated MOSFETs and MOSFETs with a top gate and a backside ground plane are more immune to short-channel effects and hence can be scaled to shorter dimensions than conventional MOSFETs.

The structure of a typical prior art double-gated MOSFET consists of a very thin vertical Si layer (Fin) for the channel, with two gates, one on each side of the channel. The term "Fin" is used herein to denote a semiconducting material which is employed as the body of the FET. The two gates are electrically connected so that they serve to modulate the channel. Short-channel effects are greatly suppressed in such a structure because the two gates very effectively terminate the drain field line preventing the drain potential from being felt at the source end of the channel. Consequently, the variation of the threshold voltage with drain voltage and with gate length of a prior art double-gated MOSFET is much smaller than that of a conventional single-gated structure of the same channel length.

For FinFET CMOS (complementary metal oxide semiconductor) applications, it is beneficial to provide a structure that has the thinnest single crystal silicon Fin possible for the device body. However, this makes contacting of the source and drain regions quite difficult. Optimally, the device portion of the Fin is quite thin, with the source and drain regions being thicker, in order to facilitate silicide growth and metal contact schemes.

It is known in the present state of the art that stress can enhance electron and hole mobility in the channel of a FINFET, but it is difficult to apply a large stress in the channel of a FINFET.

Compressive longitudinal stress along the channel increases drive current in p-type field effect transistors (pFETs) and decreases drive current in n-type field effect transistors (nFETs). Tensile longitudinal stress along the channel increases drive current in nFETs and decreases drive current in pFETs if the tensile strength is in the order of 1.0 Gpa or less.

SUMMARY OF THE INVENTION

The present invention provides a structure of a strained FINFET and a method for manufacturing a strained FINFET that replaces a part of the gate with a stress material to apply stress to the channel of the FINFET to enhance electron and hole mobility and improve performance of the FINFET. The FINFET has a SiGe/Si stacked gate, and before silicidation the SiGe part of the gate is selectively etched to form a gate gap that makes the gate thin enough to be fully silicidated. After silicidation, the gate-gap is filled with a stress nitride film. This creates stress in the channel and enhances the performance of the FINFET.

BRIEF DESCRIPTION OF THE DRAWINGS

The foregoing objects and advantages of the present invention for a structure and method for manufacturing a strained FINFET may be more readily understood by one skilled in the art with reference being made to the following detailed description of several embodiments thereof taken in conjunction with the accompanying drawings wherein like elements are designated by identical reference numerals throughout the several views, and in which.

Figure 10:
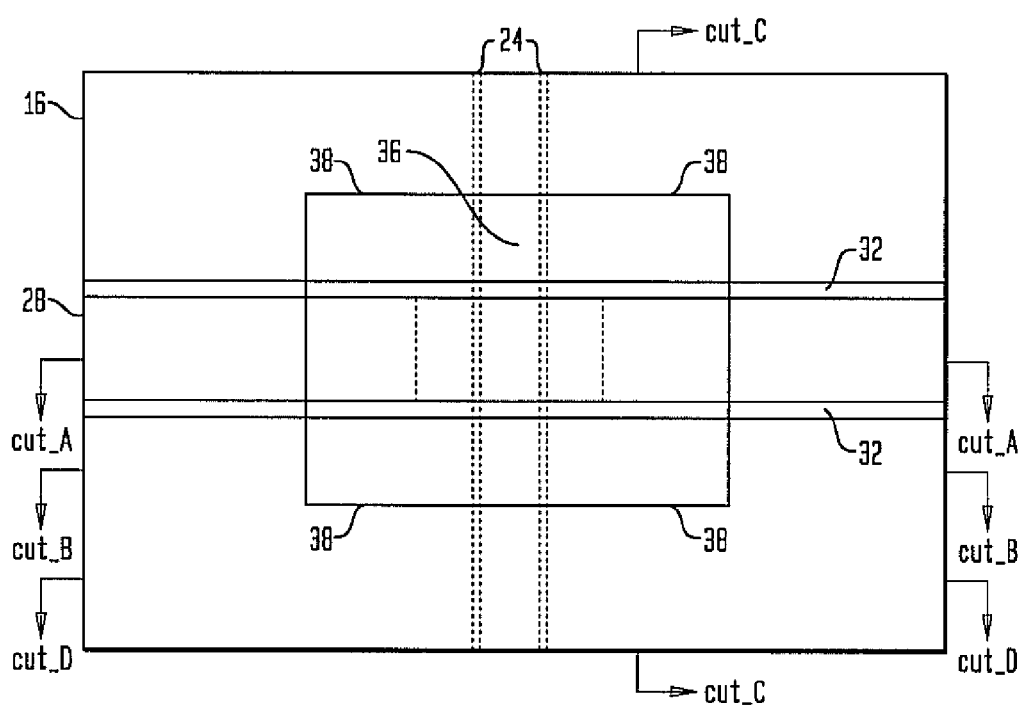
FIGS. 10, 10A, 10B, 10C and 10D illustrate depositing nitride and RIE the nitride to form nitride spacers on the gate sidewall, as shown in the top view of FIG. 10, the side sectional view of FIG. 10A taken along arrows A-A in FIG.
Figure 10A:
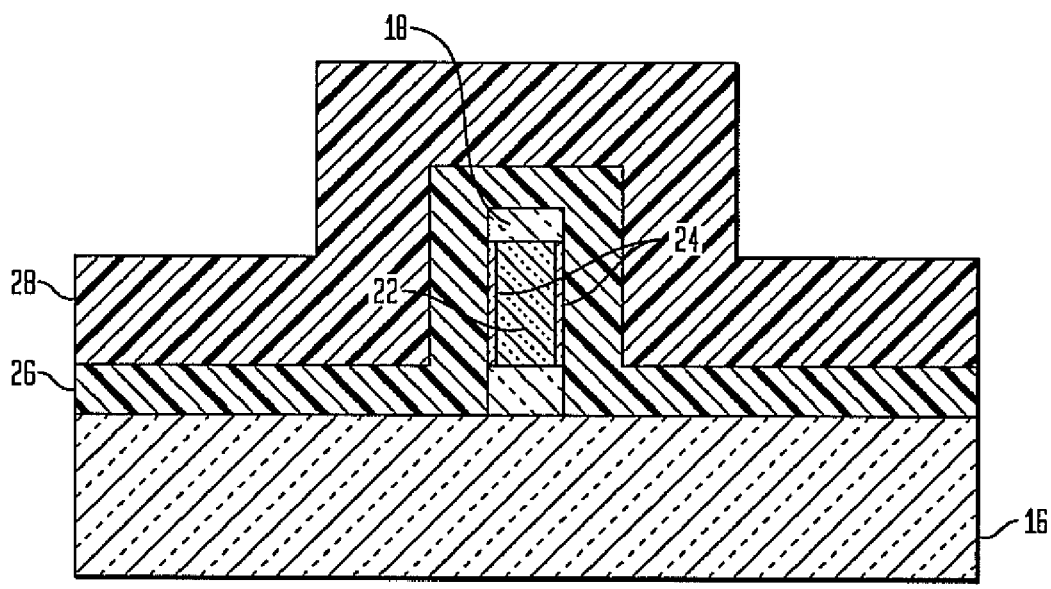
Figure 10B:
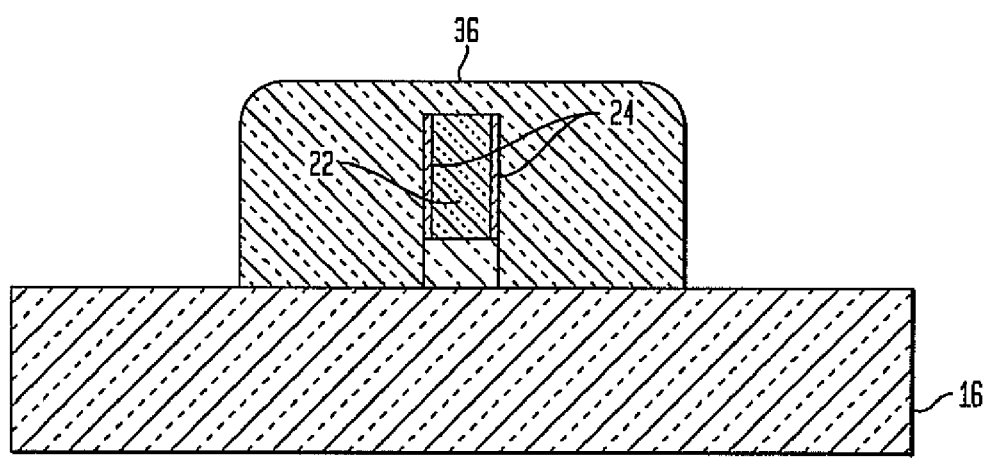
Figure 10C:
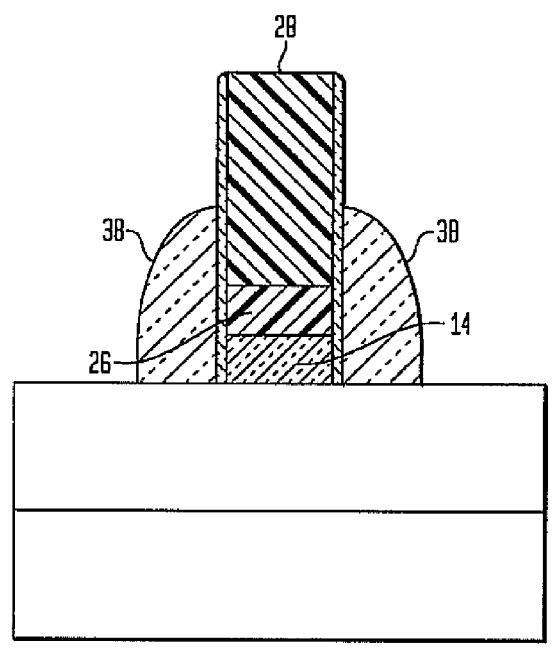
Figure 10D:
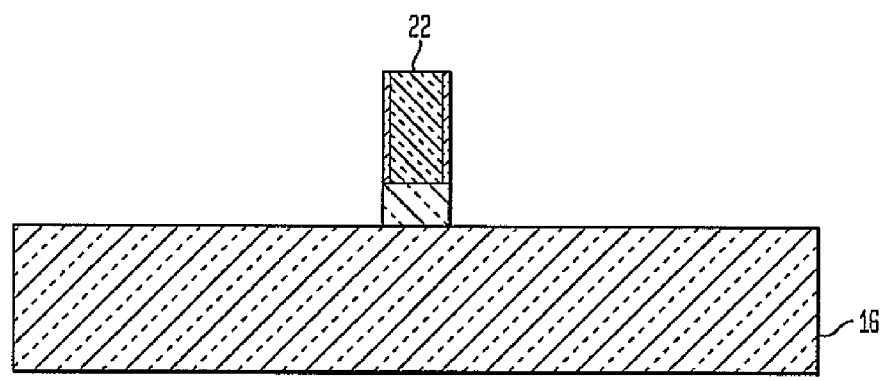

10, the side sectional view of FIG. 10B taken along arrows B-B in FIG. 10, the side sectional view of FIG. 10C taken along arrows C-C in FIG. 10, and the side sectional view of FIG. 10D taken along arrows D-D in FIG. 10.

Figure 11A:
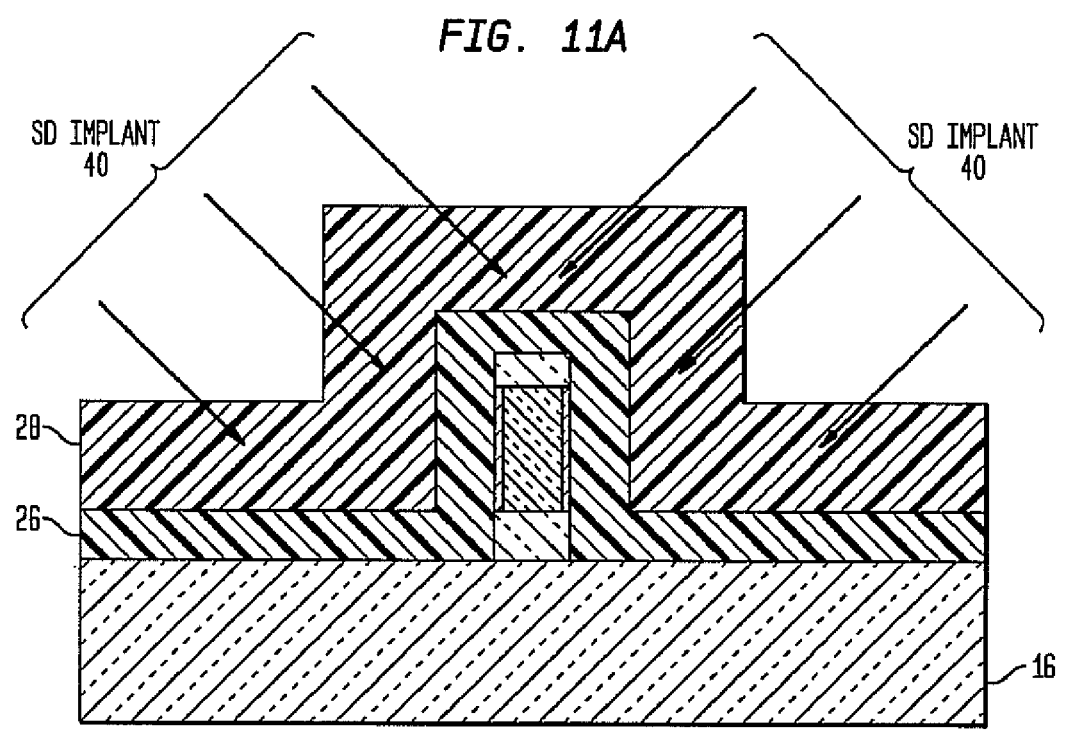
Figure 11D:
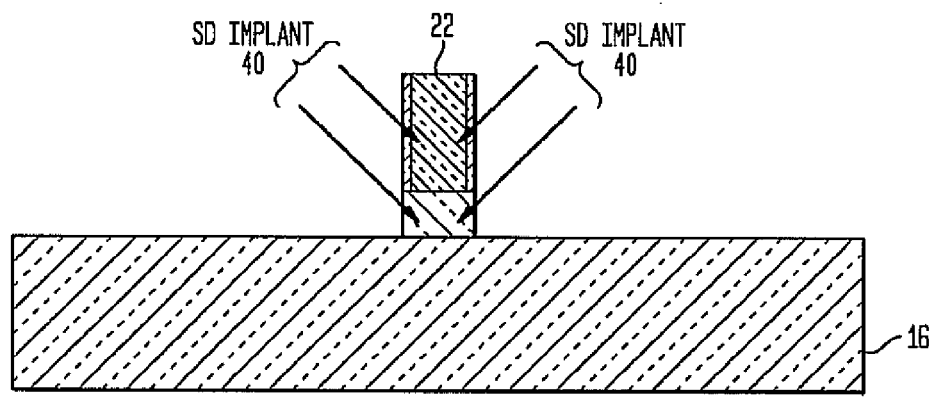

FIGS. 11A and 11D illustrate SD (source drain) implantation and annealing, as shown in the side sectional view of FIG. 11A taken along arrows A-A (as in FIG. 10), and the side sectional view of FIG. 11D taken along arrows D-D (as in FIG. 10).

Figure 12:
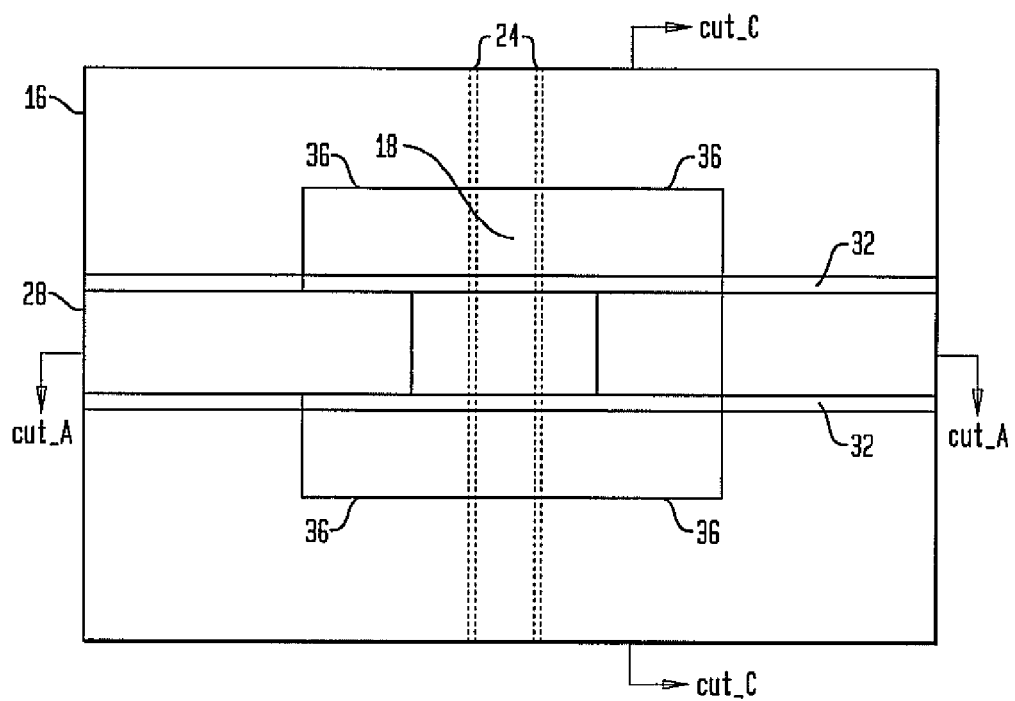
Figure 12A:
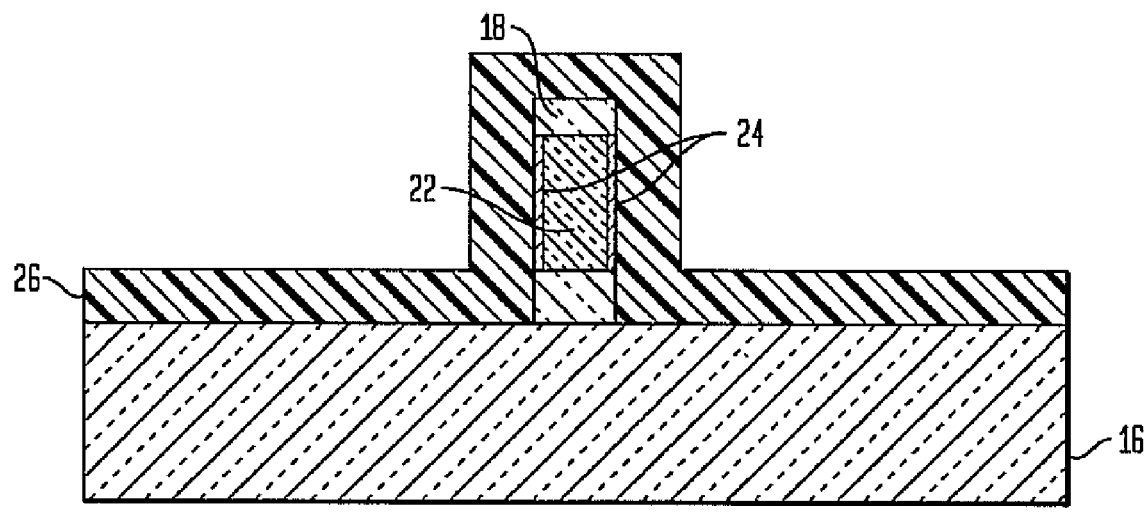
Figure 12C:
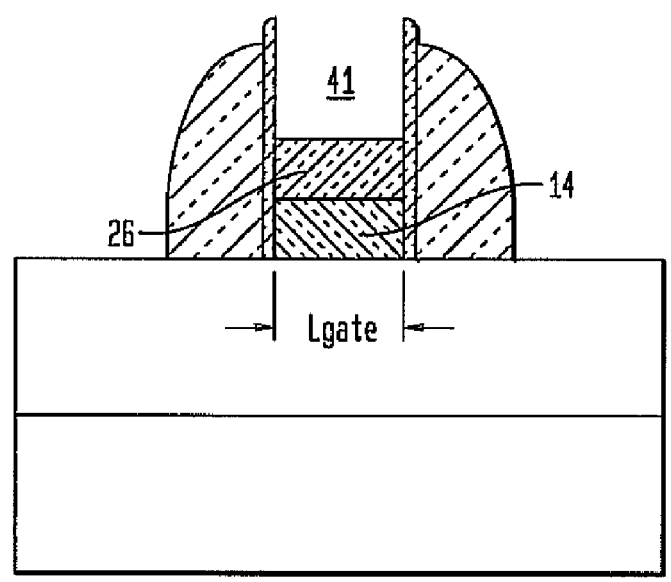

FIGS. 12, 12A and 12C illustrate etching poly-SiGe selective to Si, as shown in the top view of FIG. 12, the side sectional view of FIG. 12A taken along arrows A-A in FIG. 12, and the side sectional FIG. 12C taken along arrows C-C in FIG. 12.

Figure 13:
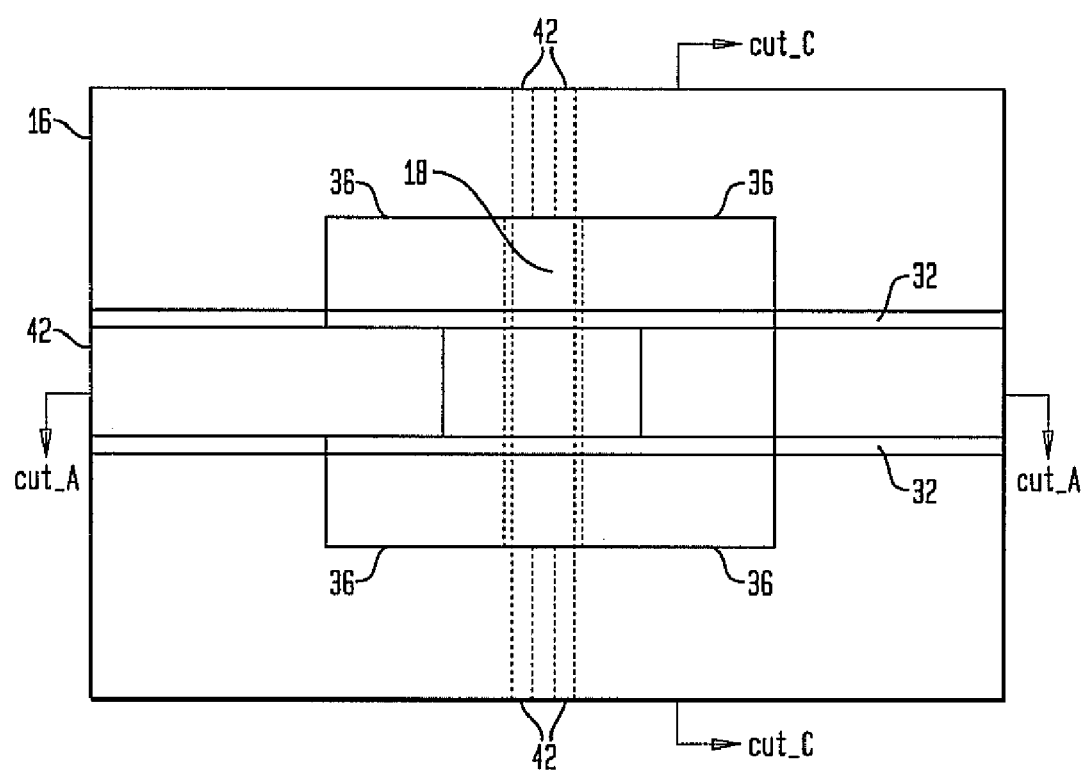
Figure 13A:
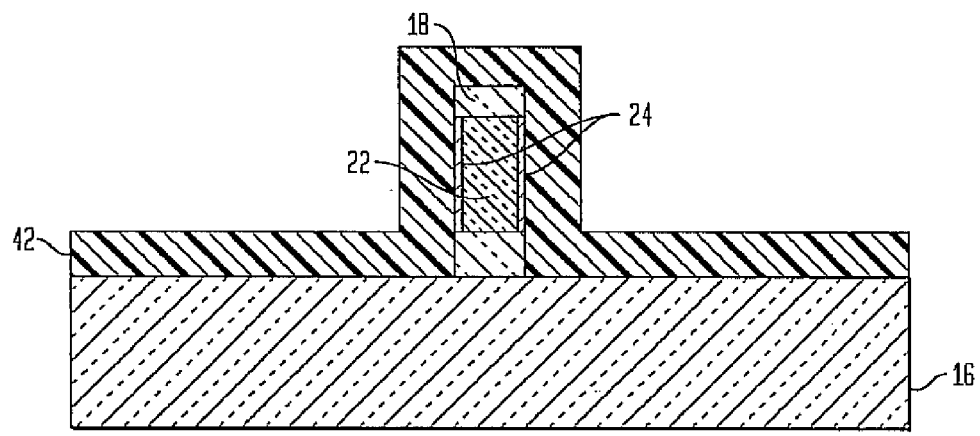
Figure 13C:
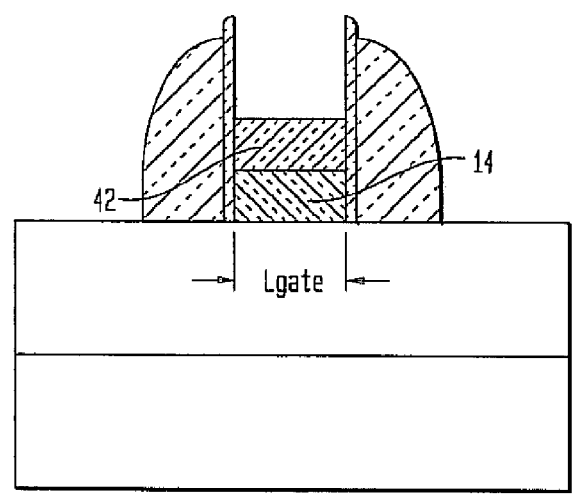

FIGS. 13, 13A and 13C illustrate a conventional method to form a silicide contact, as shown in the top view of FIG. 13, the side sectional view of FIG. 13A taken along arrows A-A in FIG. 13, and the side sectional FIG. 13C taken along arrows C-C in FIG. 13.

Figure 14:
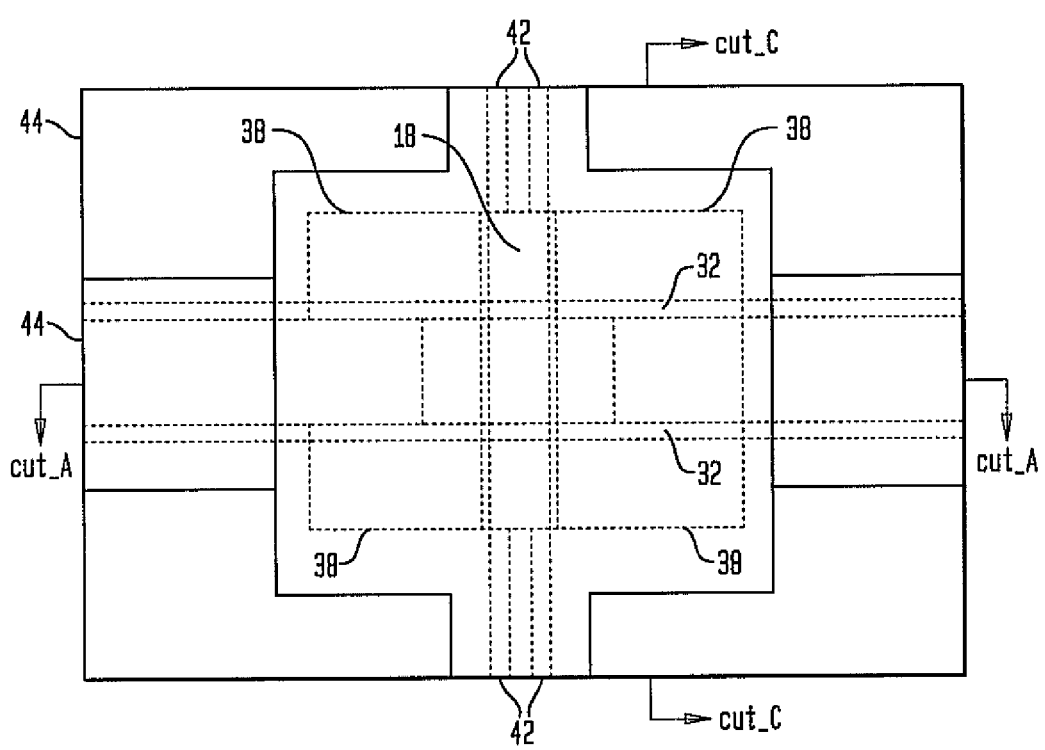
Figure 14A:
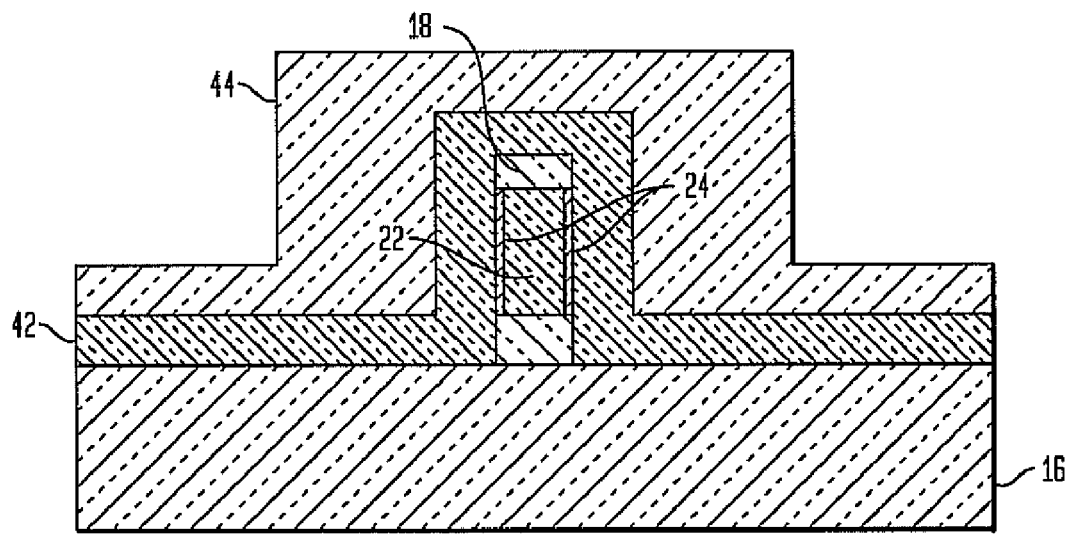
Figure 14C:
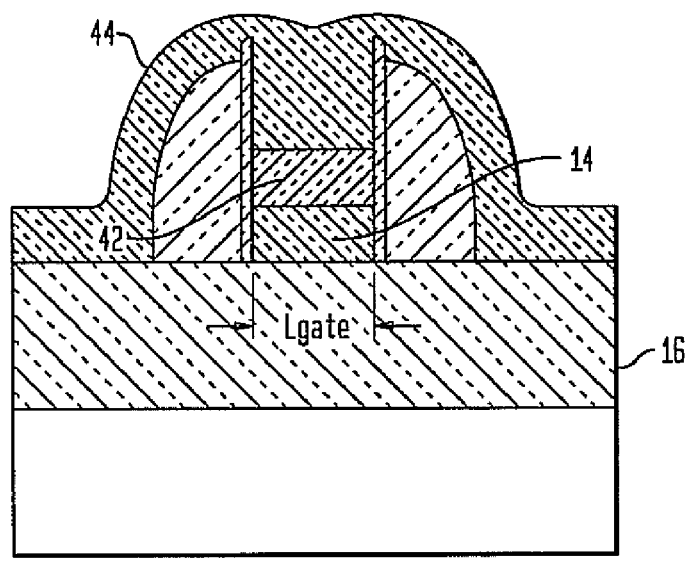

FIGS. 14, 14A and 14C illustrate depositing stress nitride film to fill the gap of the gate, as shown in the top view of FIG. 14, the side sectional view of FIG. 14A taken along arrows A-A in FIG. 14, and the side sectional FIG. 14C taken along arrows C-C in FIG. 14.

Figure 15:
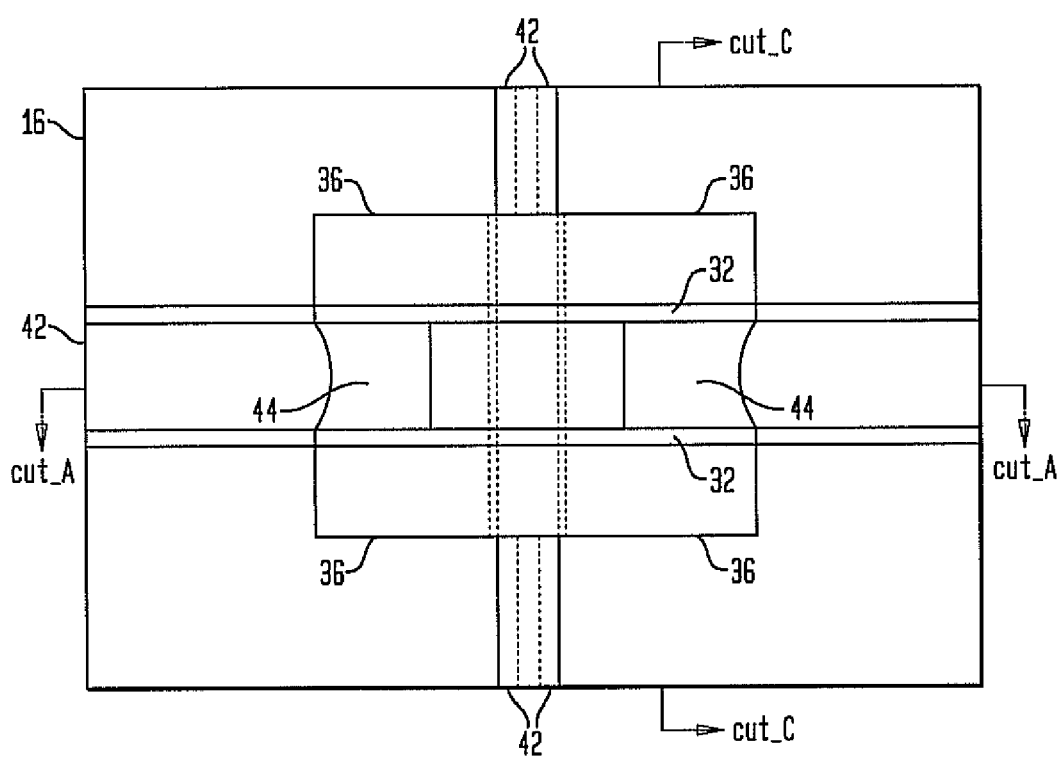
Figure 15A:
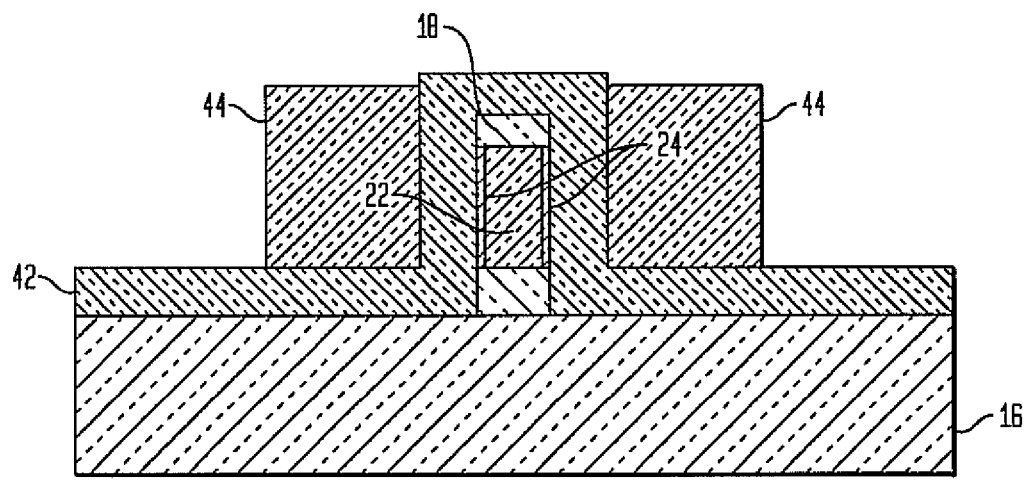
Figure 15C:
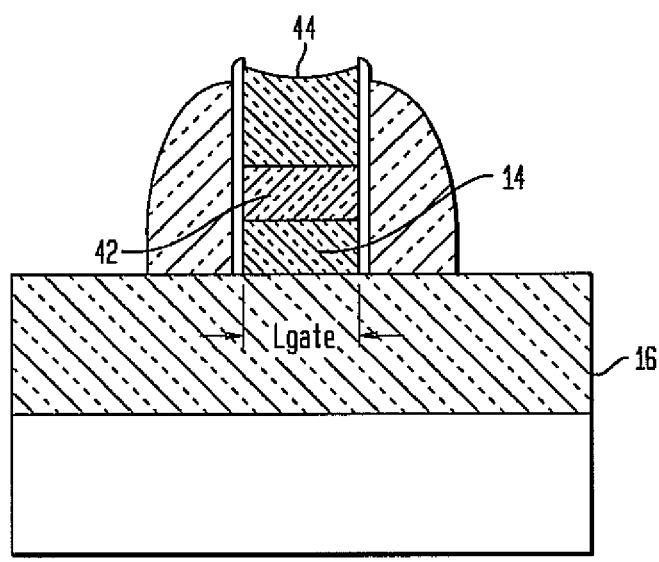

FIGS. 15, 15A and 15C illustrate isotropically etching back the stress nitride film, as shown in the top view of FIG. 15, the side sectional view of FIG. 15A taken along arrows A-A in FIG. 15, and the side sectional FIG. 15C taken along arrows C-C in FIG. 15.

DETAILED DESCRIPTION OF THE INVENTION

Stress can enhance electron and hole mobility, but it is difficult to apply a large stress in the channel of a FIN FET device. The present invention replaces a part of the gate of a FINFET with a stress material to apply stress to the channel of the FINFET to enhance electron and hole mobility and improve performance of the FINFET. More particularly, the present invention replaces the SiGe part of a SiGe/Si stacked gate of a FINFET with a stress nitride film to apply stress to the channel of the FINFET to enhance electron and hole mobility and improve performance of the FINFET.

In general, the present invention uses a SiGe/Si stacked gate to replace a poly-Si gate. Before silicidation, selectively etch the SiGe part of the gate to make the gate thin enough to be fully silicided. After silicidation and etching of residual metal, refill the gate-gap with stress nitride film. This creates stress in the channel and enhances the performance of the FINFET. Other process steps can be exactly the same as the steps for making a conventional FINFET.

The following steps correspond generally to the illustrations in FIGS. 1 through 15.

Figure 1:
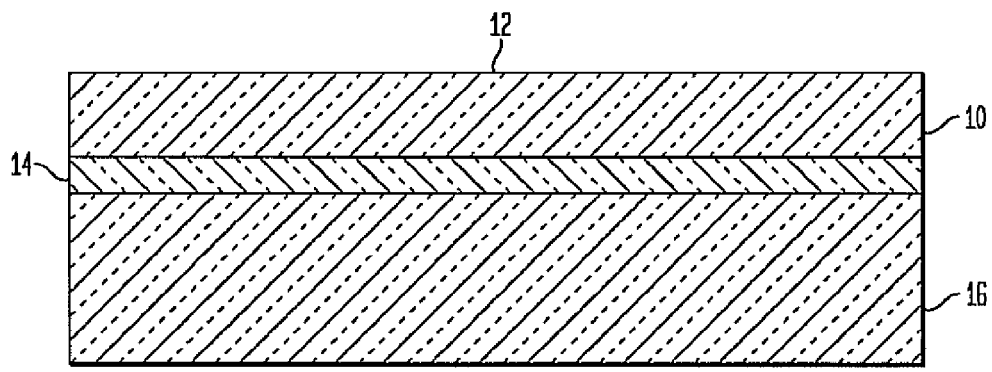
FIG. 1 illustrates a silicon on insulator (SOI) wafer on buried oxide (BOX).

Initially, start with a SOI 10 (silicon 12 on oxide insulator 14) wafer (SOI thickness ~50-100 nm) on BOX (buried oxide) 16, as shown in FIG. 1. The substrate is preferably SOI, but is not limited to SOI and can include any semiconducting material such as GaAs, InAs and other like semiconductors. Si-containing materials include, but are not limited to: Si, bulk Si, single crystal Si, polycrystalline Si, SiGe, amorphous Si, silicon-on-insulator (SOI), SiGe-on-insulator (SGOI), strained-silicon-on-insulator, annealed poly Si, and poly Si line structures.

When the substrate 10 is a silicon-on-insulator (SOI) or SiGe-on-insulator (SGOI) substrate, the thickness of the Si-containing layer atop the buried insulating layer can have a thickness on the order of 10 nm or greater. The insulator or dielectric can be an oxide, a nitride, or an oxynitride The SOI or SGOI substrate may be fabricated using techniques that are well known to those skilled in the art. For example, the SOI or SGOI substrate may be fabricated using a thermal bonding process, or alternatively be fabricated by an ion implantation process, which is referred to in the art as separation by ion implantation of oxygen (SIMOX).

The gate dielectric layer formed atop the substrate is preferably an oxide or nitride material, and is generally greater than 0.8 nm thick, and preferably from about 1.0 nm to about 6.0 nm thick. The gate dielectric layer may also be composed of an oxynitride, or a combination of such materials. The gate dielectric layer is formed using conventional techniques such as chemical vapor deposition (CVD), atomic layer CVD (ALCVD), pulsed CVD, plasma assisted CVD, sputtering, and chemical solution deposition, or alternatively, the gate dielectric layer is formed by a thermal growing process, which may include oxidation, oxynitridation, nitridation, and/or plasma or radical treatment. Suitable examples of oxides that can be employed as the gate dielectric include, but are not limited to: $SiO_2$, $Al_2O_3$, $ZrO_2$, $HfO_2$, $Ta_2O_3$, $TiO_2$, perovskite-type oxides and combinations and multi-layers thereof. The gate dielectric layer is subsequently etched to form the gate dielectric.

Figure 2:
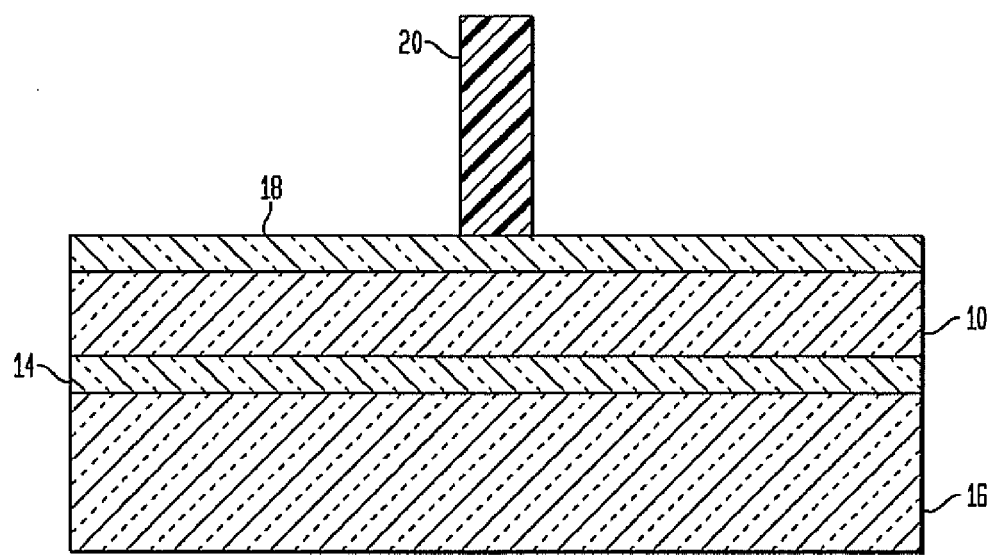
FIG. 2 shows conventional steps to make a Si fin.
Figure 3:
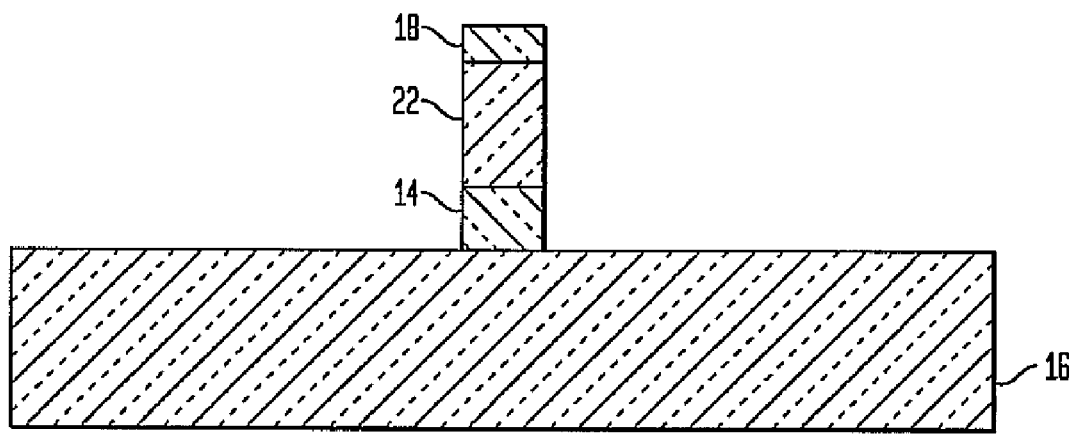
FIG. 3 illustrates a Si fin formed on the BOX.

Follow conventional steps to make a Si fin. Deposit a hard mask nitride layer 18 (~20-40 nm) and pattern photoresist (PR) 20, as shown in FIG. 2. Reactive ion etch (RIE) the nitride 18, RIE SOI 10 stopping on BOX 16, time RIE oxide/BOX to achieve an etch depth of ~20-40 nm (to apply more uniform stress across the Si fin, etch into BOX) and remove the PR 20, as shown in FIG. 3.

The structure is fabricated utilizing conventional processes well known to those skilled in the art. For example, the hard mask 18 is formed atop the layer of semiconductor material 10 by utilizing conventional deposition processes such as chemical vapor deposition (CVD), plasma-assisted CVD, or chemical solution deposition. Alternatively, the hard mask may be grown on a semiconductor body utilizing a conventional thermal oxidation process, followed by a nitridation process. Both of these thermal processes, i.e., oxidation and nitridation, are well known to those skilled in the art. The present invention also contemplates forming one material layer of the hard mask via deposition, and forming another material layer via a thermal oxidation/nitridation process.

Next, as shown in FIGS. 2A-2B, the nitride layer 18 is patterned utilizing conventional lithography and etching. Specifically, the lithographic process includes applying a photoresist to the nitride layer, exposing the photoresist to a pattern of radiation and developing the pattern into the photoresist utilizing a conventional resist developer. After patterning of the photoresist, the exposed portions of the nitride layer, not protected by the patterned photoresist, are removed utilizing an etching process that is highly selective in removing nitride as compared to oxide.

Suitable types of etching that can be employed in forming the patterned nitride layer include, but are not limited to: reactive-ion etching, ion beam etching, plasma etching or laser ablation. After this etching step, the photoresist may be removed from the structure.

Figure 4:
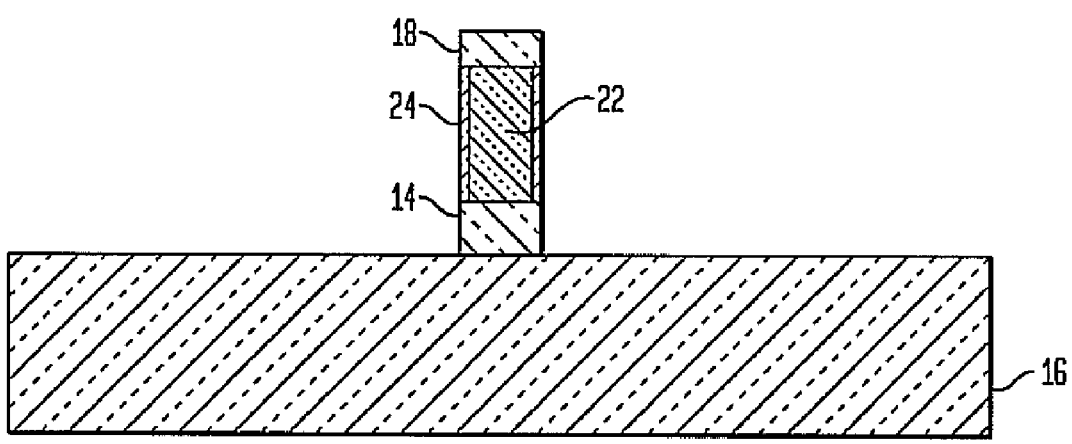
FIG. 4 illustrates thermal oxidation to form gate oxide on the sidewalls of the Si fin.

Then thermally oxidize the Si fin 22 to form gate oxide 24 on the sidewalls of the Si fin, as shown in FIG. 4. In alternative embodiments other forms of sidewall protection are available by the use of nitrides and oxynitrides.

Figure 5:
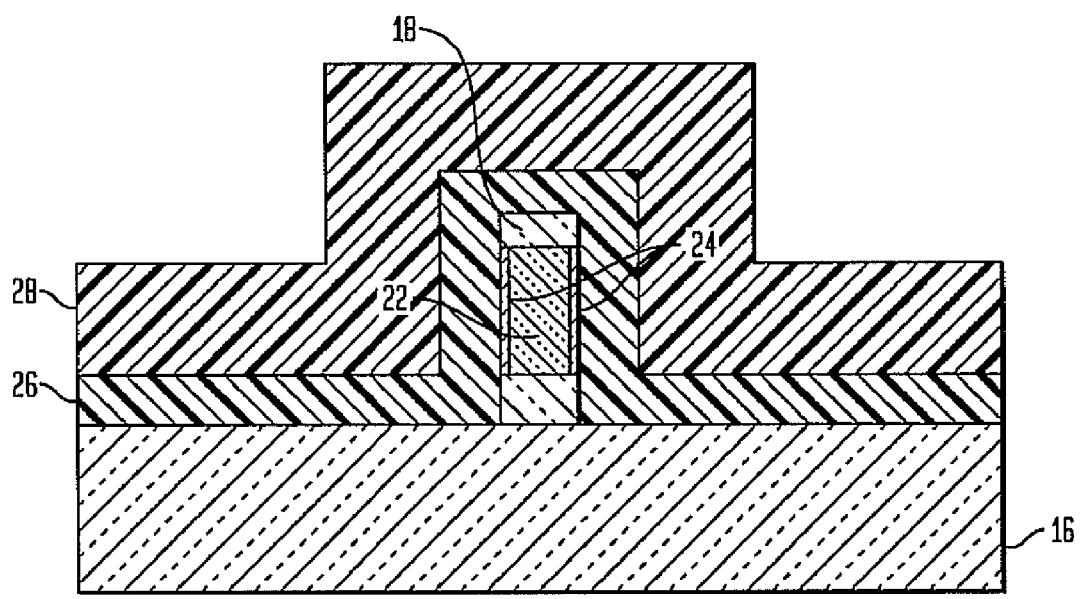
FIG. 5 shows depositing a layer of poly-Si and then a layer of poly-SiGe.

Next deposit a layer of poly-Si 26 (~20-30 nm) and then a layer of poly-SiGe 28 (~80-100 nm), as shown in FIG. 5.

The poly-Si 26 can also be other forms of semiconductor or Si as noted herein. Likewise, the layer of poly-SiGe 28 can also be other forms of semiconductor such as Ge. It is important that the two materials etch differently in the subsequent etching step shown in association with FIG. 12.

Figure 6:
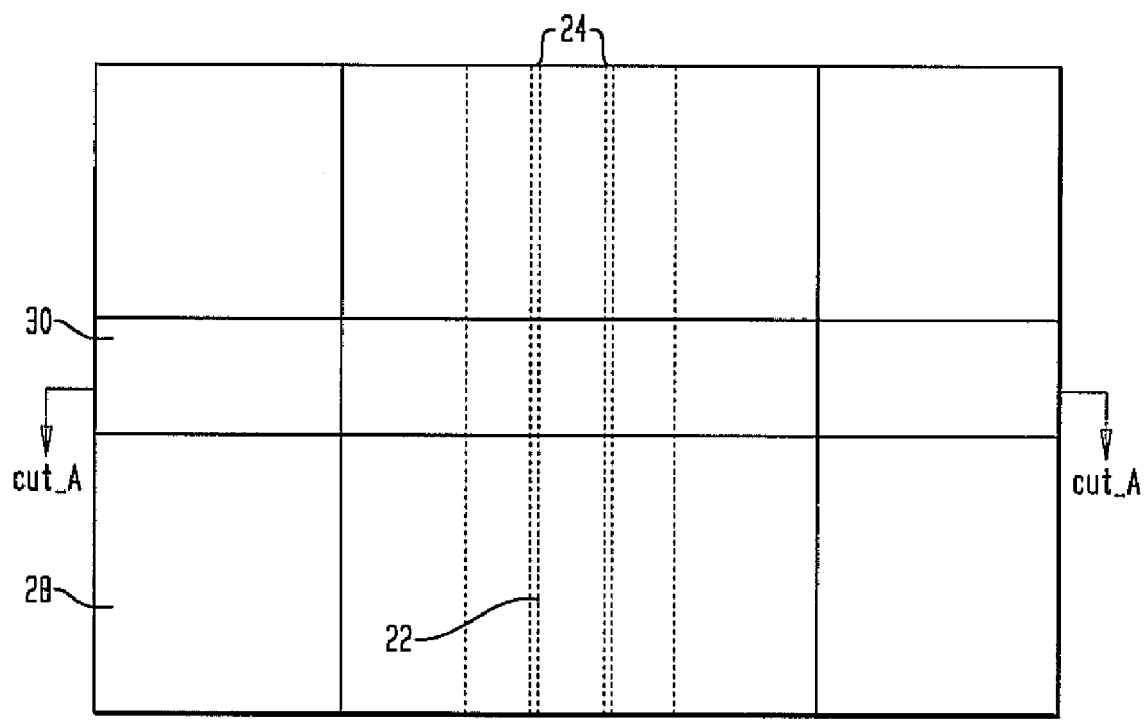
FIGS. 6 and 6A illustrate patterning photoresist (PR) for a gate reactive ion etch (RIE), as shown in the top view of FIG. 6 and the side sectional view of FIG. 6A taken along arrows A-A in FIG. 6.
Figure 6A:
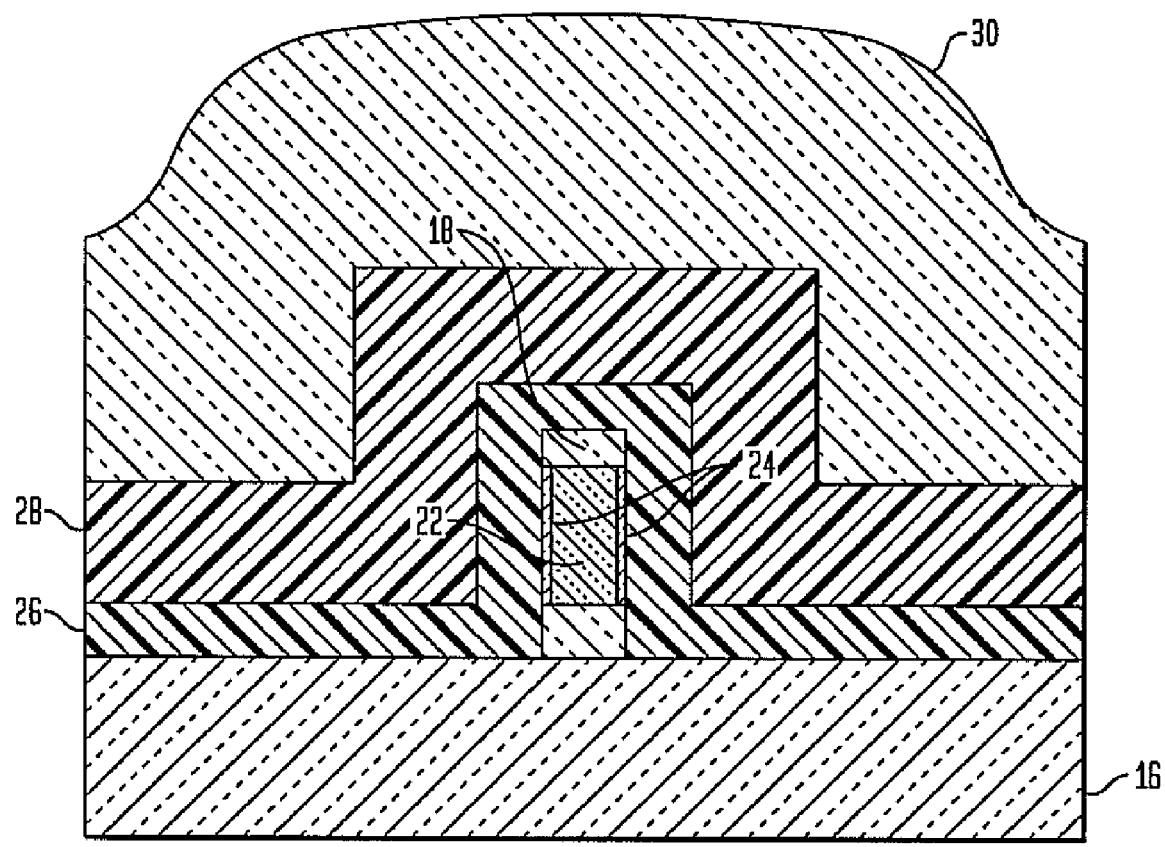
Figure 7:
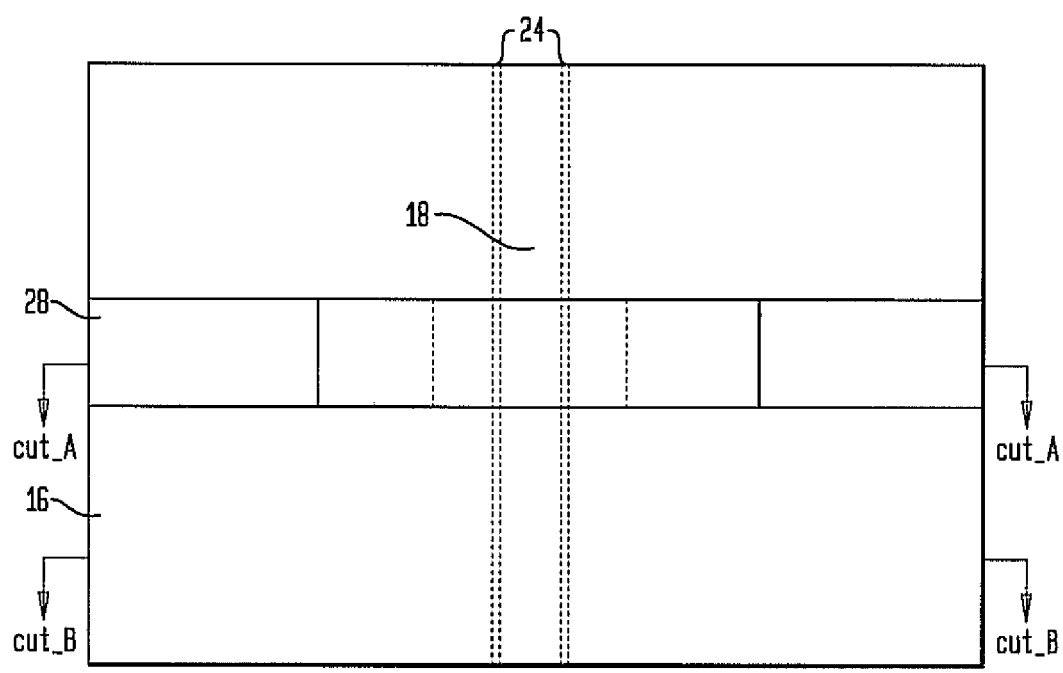
FIGS. 7, 7A and 7B illustrate RIE poly-SiGe and RIE poly-Si to form the gate, as shown in the top view of FIG. 7, the side sectional view of FIG. 7A taken along arrows A-A in FIG. 7, and the side sectional view of FIG. 7B taken along arrows B-B in FIG. 7.
Figure 7A:
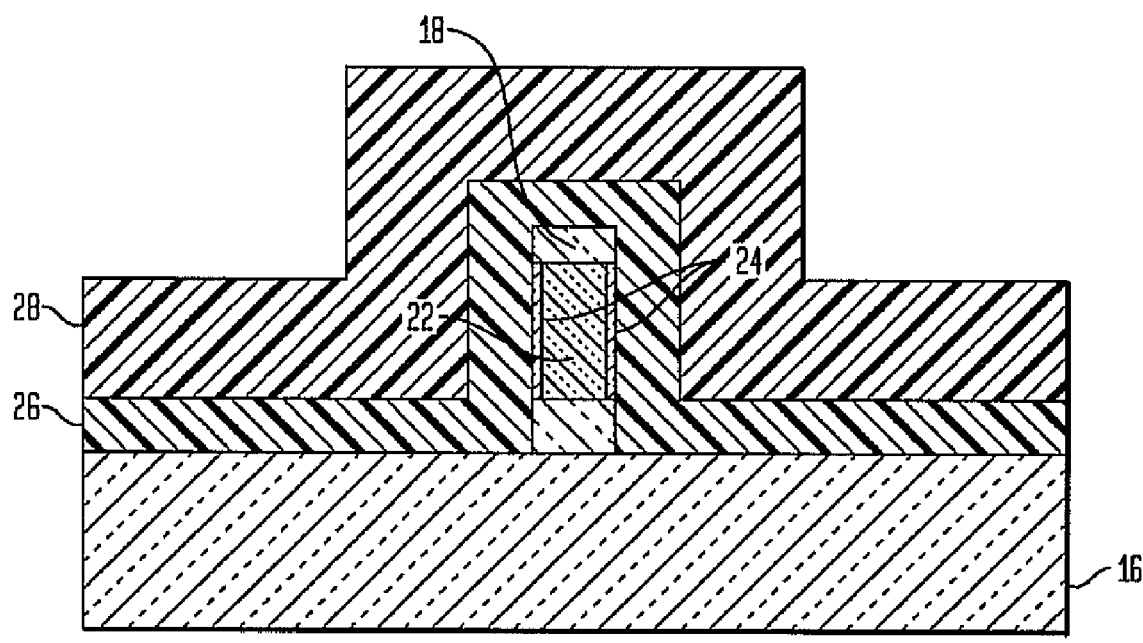
Figure 7B:
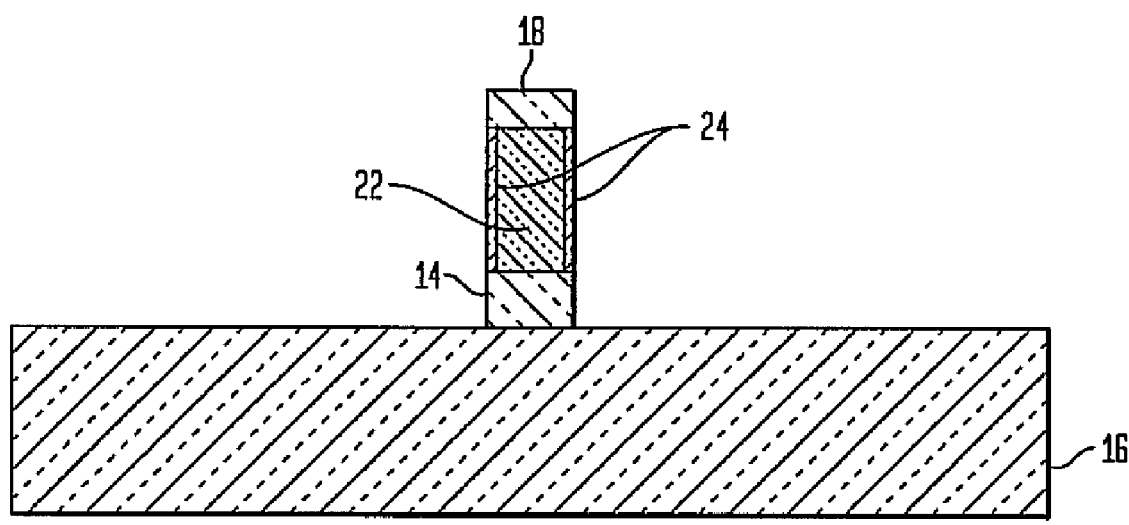

Then pattern PR 30 for gate RIE, as shown in the top view of FIG. 6 and the side sectional view of FIG. 6A taken along arrows A-A in FIG. 6. Next RIE the poly-SiGe 28 and RIE poly-Si 26 to form gate, and remove the PR 30, as shown in the top view of FIG. 7, and the side sectional view of FIG. 7A taken along arrows A-A in FIG. 7, and the side sectional view of FIG. 7B taken along arrows B-B in FIG. 7.

Figure 8:
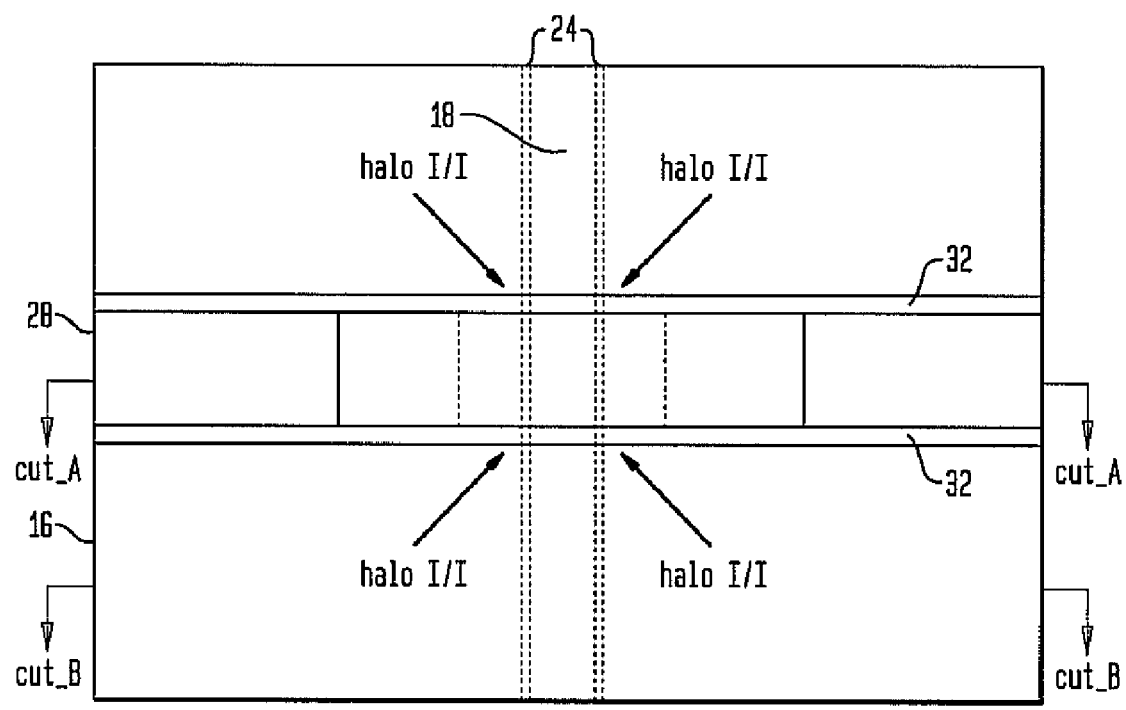
FIG. 8 is a top view showing thermal re-oxidation to form a thin oxide to protect the gate sidewall and/or to act as a spacer for extension implantation.

Then thermally re-oxidize to form a thin oxide 32 to protect the gate sidewall and/or to act as a spacer for extension implantation, as shown in the top view of FIG. 8. In alternative embodiments other forms of protection are available in nitrides and oxynitrides. However thermal re-oxidation is preferred as it rounds the corners.

Figure 9:
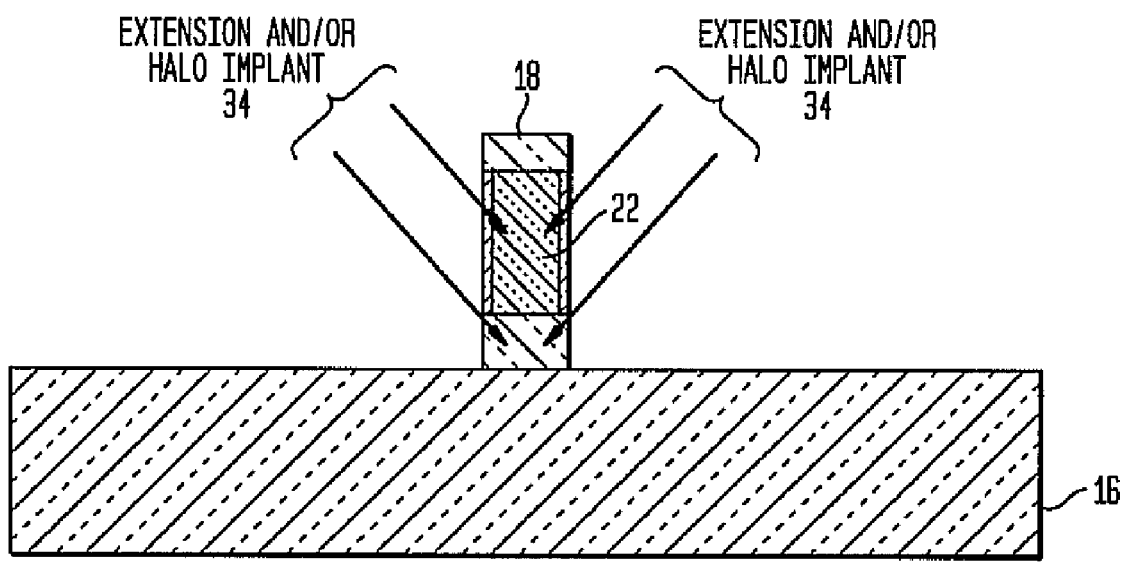
FIG. 9 is a side sectional view taken along arrows B-B (as in FIG. 8) that illustrates an angled dopant implantation for extension formation.

Next do angled dopant implantation 34 for extension formation, as shown in the side sectional view of FIG. 9 taken along arrows B-B (as in FIG. 8). If needed, halo implantation can be performed, as indicated by the halo ion/implant (halo I/I) arrows in FIG. 8. All implantation steps are the same as those for conventional FINFET manufacturing.

Then deposit nitride (30-50 nm) and RIE the nitride to form nitride spacers 36 on the gate sidewall, as shown in the top view of FIG. 10, and the side sectional view of FIG. 10A taken along arrows A-A in FIG. 10, and the side sectional view of FIG. 10B taken along arrows B-B in FIG. 10, and the side sectional view of FIG. 10C taken along arrows C-C in FIG. 10 which also shows Lgate, and the side sectional view of FIG. 10D taken along arrows D-D in FIG. 10. This process is again the same as a conventional step for forming spacers of a FINFET.

Next do SD (source drain) dopant implantation 38 and SD annealing. The SD dopant implantation 38 dopes the SD areas as well as the gate, and can be used to adjust the threshold voltage of the FINFET devices for fully silicided gate of FINFET, as shown in the side sectional view of FIG. 11A taken along arrows A-A (as in FIG. 10), and the side sectional view of FIG. 11D taken along arrows D-D (as in FIG. 10). A conventional implantation process is performed so as to form source/drain implant regions in the structure in areas adjacent to the Fin 22. The doping at this point may be either n or p-type. In one embodiment of the present invention the exposed areas adjacent to Fin 22 are doped using different implant species such as As and B so as to form source/drain regions which have donor or acceptor impurities, respectively.

Then dry etch (plasma) the poly-SiGe 28 selective to Si 26, as shown in the top view of FIG. 12, and the side sectional view of FIG. 12A taken along arrows A-A in FIG. 12, and the side sectional FIG. 12C taken along arrows C-C in FIG. 12 which shows the SiGe part of the gate removed to form a gap 40 above the poly-Si and to make the gate thin enough to be fully silicided. In this case, the SiGe part of the gate is etched away to form the gap and the gate becomes thinner, which increases the resistance of the gate. The later silicidation process decreases the resistance of the gate to a more acceptable level.

Then follow conventional methods to make the silicide contact, as shown in the top view of FIG. 13, and the side sectional view of FIG. 13A taken along arrows A-A in FIG. 13, and the side sectional FIG. 13C taken along arrows C-C in FIG. 13. First wet etch thin oxide in SD areas. Then deposit a thin metal film (preferably 4-10 nm Ni) and anneal (at 300-450 C) to form NiSi 42. Then wet etch residual metal. During the silicidation process the poly-Si transforms into the NiSi 42

Next deposit a stress nitride film 44 to fill the gap of the gate, as shown in the top view of FIG. 14, and the side sectional view of FIG. 14A taken along arrows A-A in FIG. 14, and the side sectional FIG. 14C taken along arrows C-C in FIG. 14. Preferably deposit compressive nitride film for nFINFET and tensile nitride film for pFINFET. The compressive nitride film or tensile nitride film can be selectively deposited by changing the power of the plasma deposition, as is known in the art. Other stress materials such as metals such as tungsten can be used in the present invention instead of the nitride film, but the nitride film has an advantage in conformity.

The stress inducing film of the present invention can comprise a nitride, preferably $Si_3N_4$, or alternatively TiN, an oxide, $Al_2O_3$, $HfO_2$, $ZrO_2$, HfSiO, and other dielectric materials that are common to semiconductor processing or any combination thereof. The stress inducing film can have a thickness ranging from about 10 nm to about 100 nm. The stress inducing film may provide a compressive stress in the device channel to improve pFET performance or provide a tensile stress in the device channel to improve nFET performance.

Then isotropically etch back the stress nitride film, as shown in the top view of FIG. 15, and the side sectional view of FIG. 15A taken along arrows A-A in FIG. 15, and the side sectional FIG. 15C taken along arrows C-C in FIG. 15. The stresses in the channel from the stress films in the gate and in the SD areas can cancel/reduce each other. This nitride-pull-back step enhances the stress in the channel since the stress film in the SD areas are removed. After this step, follow the conventional process to finish the device.

Another option is use another stress nitride film to cover the whole device to further stress the channel. This time preferably use a tensile film for an nFINFET and a compressive film for a pFINFET.

While several embodiments and variation of the present invention for a structure and method for manufacturing strained FINFET are described in detail herein, it should be apparent that the disclosure and teachings of the present invention will suggest many alternative designs to those skilled in the art.

What is claimed is:

1. A method for fabricating a strained fin field effect transistor (FINFET) that uses stress material to replace a part of the gate to apply stress to the channel of the FINFET, comprising:

fabricating the FINFET with a source, a drain and a stacked gate comprised of two different types of semiconductor materials that have different etching characteristics;

selectively etching one of the two different types of semiconductor materials of the stacked gate to form a gate gap;

refilling the gate gap with a stress film to create stress in the FINFET channel, to enhance electron and hole mobility and to improve the performance of the FINFET.

2. The method of claim 1, including fabricating the stacked gate as a poly-SiGe/poly-Si stacked gate, and selectively etching the poly-SiGe part of the gate to form the gate gap.

3. The method of claim 1, including refilling the gate gap with a stress nitride film to create stress in the FINFET channel.

4. The method of claim 1, including refilling the gate gap with a compressive stress nitride film to create stress in a pFINFET channel.

5. The method of claim 1, including refilling the gate gap with a tensile stress nitride film to create stress in an nFINFET channel.

6. The method of claim 1, including covering the FINFET with a further stress nitride film to further stress the channel.

7. The method of claim 1, including covering an nFINFET with a further tensile stress nitride film to further stress the channel of the nFINFET.

8. The method of claim 1, including covering a pFINFET with a further compressive stress nitride film to further stress the channel of the pFINFET.

9. A method for fabricating a strained fin field effect transistor (FINFET) that uses stress material to replace a part of the gate to apply stress to the channel of the FINFET, comprising:

starting with a Si fin having a sidewall protection layer on sidewalls of the Si fin, depositing a layer of poly-Si and then a layer of poly-SiGe on the Si fin;

patterning photoresist (PR) for a gate reactive ion etch (RIE);

RIE poly-SiGe and RIE the poly-Si to form a gate;

Etching the poly-SiGe selective to poly-Si, wherein the SiGe part of the gate is etched away to form a gap in the gate;

forming silicide contacts; and depositing stress film to fill the gap in the gate.

10. The method of claim 9, wherein following the RIE steps:

implanting dopant for extension formation;

depositing nitride and RIE the nitride to form nitride spacers on the gate sidewalls; and source and drain (S/D) dopant implantation and annealing.

11. The method of claim 9, wherein following the RIE steps:

thermally re-oxidizing the gate sidewalls to form a thin oxide to protect the gate sidewalls and/or to act as a spacer for extension implantation; and angled dopant implantation for extension formation.

12. The method of claim 9, wherein following the step of depositing stress film, isotropically etching back the stress film to remove the stress film in source and drain areas.

13. The method of claim 9, including forming silicide contacts by wet etching thin oxide in source and drain areas, depositing thin Ni and annealing to form NiSi.

14. The method of claim 9, including depositing compressive stress nitride film for a pFINFET.

15. The method of claim 9, including depositing tensile stress nitride film for an nFINFET.

16. The method of claim 9, including covering the FINFET with another stress nitride film to further stress the channel.

17. The method of claim 9, including covering an nFINFET with another tensile stress nitride film to further stress the channel.

18. The method of claim 9, including covering a pFINFET with another compressive stress nitride film to further stress the channel.

* * * * *